(12) United States Patent
Shi et al.

(10) Patent No.: US 7,622,796 B2
(45) Date of Patent: Nov. 24, 2009

(54) SEMICONDUCTOR PACKAGE HAVING A BRIDGED PLATE INTERCONNECTION

(75) Inventors: Lei Shi, Shanghai (CN); Ming Sun, Sunnyvale, CA (US); Kai Liu, Mountain View, CA (US)

(73) Assignee: Alpha and Omega Semiconductor Limited, Sunnyvale, CA (US)

( * ) Notice: Subject to any disclaimer, the term of this patent is extended or adjusted under 35 U.S.C. 154(b) by 0 days.

(21) Appl. No.: 11/906,136

(22) Filed: Sep. 28, 2007

(65) Prior Publication Data

US 2008/0087992 A1  Apr. 17, 2008

Related U.S. Application Data

(63) Continuation-in-part of application No. 11/226,913, filed on Sep. 13, 2005.

(51) Int. Cl.
H01L 23/02 (2006.01)
(52) U.S. Cl. .................. 257/678; 257/341; 257/401; 257/522; 257/579; 257/587; 257/692; 257/735; 257/E21.451; 257/E29.318
(58) Field of Classification Search ............ 257/341, 257/401, 522, 579, 587, 692, 735, E21.451, 257/E29.318
See application file for complete search history.

(56) References Cited

U.S. PATENT DOCUMENTS

| | | | | |
|---|---|---|---|---|
| 3,735,017 A | * | 5/1973 | Manning | 174/529 |
| 3,737,738 A | * | 6/1973 | Koenig | 257/724 |
| 3,842,189 A | | 10/1974 | Southgate | |
| 4,083,063 A | | 4/1978 | Yu | |
| 4,104,786 A | | 8/1978 | Boah et al. | |
| 4,418,470 A | * | 12/1983 | Naster et al. | 438/149 |
| 4,996,582 A | * | 2/1991 | Nagahama | 257/280 |
| 5,480,841 A | | 1/1996 | Bickford et al. | |
| 5,753,942 A | | 5/1998 | Seok | |
| 5,864,169 A | * | 1/1999 | Shimura et al. | 257/587 |
| 6,040,626 A | | 3/2000 | Cheah et al. | |
| 6,136,702 A | | 10/2000 | Chandross et al. | |

(Continued)

OTHER PUBLICATIONS

U.S. Appl. No. 11/799,467, filed Apr. 30, 20078, entitled Semiconductor Package Having Dimpled Plate Interconnections, and having Ming Sun, Lei Shi and Kai Liu listed as inventors.

(Continued)

Primary Examiner—Michelle Estrada
Assistant Examiner—Jarrett J Stark
(74) Attorney, Agent, or Firm—Schein & Cai LLP; James (Jingming) Cai

(57) ABSTRACT

A semiconductor package is disclosed. The package includes a leadframe having drain, source and gate leads, and a semiconductor die coupled to the leadframe, the semiconductor die having a plurality of metalized source contacts. A bridged source plate interconnection has a bridge portion, valley portions disposed on either side of the bridge portion, plane portions disposed on either side of the valley portions and the bridge portion, and a connection portion depending from one of the plane portions, the bridged source plate interconnection connecting the source lead with the plurality of metalized source contacts. The bridge portion is disposed in a plane above the plane of the valley portions while the plane portions are disposed in a plane intermediate the plane of the bridge portion and the plane of the valley portions.

23 Claims, 8 Drawing Sheets

U.S. PATENT DOCUMENTS

| | | | |
|---|---|---|---|
| 6,249,041 B1* | 6/2001 | Kasem et al. | 257/666 |
| 6,287,126 B1 | 9/2001 | Berger et al. | |
| 6,292,140 B1* | 9/2001 | Osterman | 343/700 MS |
| 6,294,787 B1* | 9/2001 | Schieferdecker et al. | 250/349 |
| 6,316,827 B1* | 11/2001 | Asano et al. | 257/706 |
| 6,548,882 B1* | 4/2003 | Zwicknagl et al. | 257/522 |
| 6,724,067 B2* | 4/2004 | Bayraktaroglu | 257/579 |
| 6,849,930 B2 | 2/2005 | Nakajima et al. | |
| 6,881,074 B1 | 4/2005 | McLenaghan | |
| 7,230,322 B2 | 6/2007 | Funato et al. | |
| 7,253,507 B2* | 8/2007 | Kouzuki et al. | 257/678 |
| 2001/0045593 A1* | 11/2001 | De Leeuw et al. | 257/314 |
| 2003/0038341 A1* | 2/2003 | Bayraktaroglu | 257/579 |
| 2004/0124435 A1 | 7/2004 | D'Evelyn et al. | |
| 2005/0127532 A1 | 6/2005 | Luo | |
| 2005/0194638 A1* | 9/2005 | Kouzuki et al. | 257/341 |
| 2006/0012055 A1* | 1/2006 | Foong et al. | 257/780 |
| 2006/0157804 A1* | 7/2006 | Ueda | 257/401 |
| 2006/0205161 A1* | 9/2006 | Das et al. | 438/284 |
| 2007/0057368 A1 | 3/2007 | Ho | |
| 2007/0090913 A1* | 4/2007 | Kim | 336/200 |
| 2007/0114352 A1* | 5/2007 | Cruz et al. | 248/316.7 |
| 2007/0235341 A1* | 10/2007 | Mizohata et al. | 205/81 |
| 2007/0290336 A1* | 12/2007 | Sun et al. | 257/735 |
| 2008/0054438 A1* | 3/2008 | Germain et al. | 257/690 |

OTHER PUBLICATIONS

U.S. Appl. No. 12/321,761, filed Jan. 23, 2009, entitled Semiconductor package having a bridge plate connection, and having Ming Sun, Lei Shi and Kai Liu listed as inventors.

U.S. Appl. No. 12/474,107, filed May 28, 2009, entitled Semiconductor Package Having a Bridged Plate Interconnection, and having Lei Shi, Ming Sun and Kai Liu listed as inventors.

International Search Report mailed Dec. 29, 2008 for International Patent Application No. PCT/US08/11202.

Written Opinion mailed Dec. 29, 2008 for International Patent Application No. PCT/US08/11202.

International Search Report mailed Sep. 25, 2007 for International Patent Application No. PCT/US2006/035641.

Written Opinion mailed Sep. 25, 2007 for International Patent Application No. PCT/US2006/03564.

International Preliminary Report on Patentability issued Mar. 18, 2008 for International Patent Application No. PCT/US2006/03564.

Office Action Mailed Sep. 26, 2008 for U.S. Appl. No. 11/799,467, filed Apr. 30, 2007.

Non-final Rejection Mailed Feb. 27, 2007 for U.S. Appl. No. 11/226,913, filed Sep. 13, 2005.

Non-final Rejection Mailed Oct. 5, 2004 for U.S. Appl. No. 10/732,181, filed Dec. 9, 2003.

* cited by examiner

US 7,622,796 B2

SEMICONDUCTOR PACKAGE HAVING A BRIDGED PLATE INTERCONNECTION

CROSS REFERENCE TO RELATED APPLICATIONS

The present invention is a continuation-in-part application which claims priority under 35 U.S.C. 120 from Ser. No. 11/226,913 filed on Sep. 13, 2005 entitled "Semiconductor Package Having Plate Interconnections", the entire specification of which is incorporated herein by reference.

BACKGROUND OF THE INVENTION

The present invention generally relates to a semiconductor package and more particularly to a semiconductor package having a bridged source plate interconnection for connecting a power semiconductor device source metalized contact and a leadframe source lead.

Semiconductor devices are conventionally connected to leadframe leads using either plate interconnections or wire bonding. For example, U.S. Pat. No. 5,821,611 discloses a semiconductor device which comprises a first lead having a tip formed with an island, a semiconductor chip unit mounted on the island of the first lead by means of a solder layer and having a plurality of electrode bumps projecting away from the island, and a plurality of additional leads each of which has a tip electrically connected to the electrode bumps via respective solder deposits. The additional leads include at least second and third leads. The leads are alloyed to the electrode bumps in a heating furnace and the solder bumps may spread during heating and create undesirable shapes.

U.S. Pat. No. 6,040,626 discloses a semiconductor package which employs a mixed connection between a MOSFET top surface comprising a low resistance plate portion for connecting to a source and a wire bond for connecting to a gate. Wire bonding may introduce short or open circuits in the device due to device dielectric layer damage during the wire bonding process.

A semiconductor package with directly connected leads is disclosed in U.S. Pat. No. 6,249,041. A semiconductor device includes a semiconductor chip with contact areas on the top or bottom surface. A first lead assembly, formed from a semi-rigid sheet of conductive material, has a lead assembly contact attached to one of the contact areas of the semiconductor chip. The first lead assembly also has at least one lead connected to and extending from the lead assembly contact. A second lead assembly, also formed from a semi-rigid sheet of conductive material, has a lead assembly contact attached to another one of the contact areas of the semiconductor chip. The second lead assembly also has at least one lead connected to and extending from the lead assembly contact. An encapsulant encloses the semiconductor chip, the lead assembly contact of the first lead assembly and the lead assembly contact of the second lead assembly. The semiconductor device has low electrical and thermal resistance contributions from the package due to the direct connection of the lead assemblies to the chip. The lead assembly contact areas are held in contact with lead contact areas on the semiconductor chip by an electrically conductive adhesive layer. The electrically conductive adhesive layer may be a silver-filled epoxy or polyimide paste or solder bumps. The adhesive layer may be cured in a curing oven, if necessary. The adhesive layer does not include soft solder or solder paste.

Another semiconductor package with directly connected leads is disclosed in U.S. Pat. No. 6,479,888. A MOSFET comprises a plurality of inner leads electrically connected to a surface electrode of a semiconductor pellet having a field effect transistor on a principal surface thereof. The inner leads are mechanically and electrically connected to the principal surface by a gate connecting portion and source connecting portions constituted by bumps.

A common problem encountered in the use of patterned plate or clip interconnections is that the plates or clips may float during solder reflow and result in a misaligned interconnection. In some cases, the misalignment results in a short circuit between the source and gate contact areas resulting in low assembly yields. Furthermore, it is difficult to control the required solder volume to prevent this problem.

Another problem resulting from the use of patterned plate or clip interconnections is the thermal expansion mismatch between the silicon of the semiconductor device and the metal of the patterned plate or clip. The larger the contact area of the patterned plate or clip, the higher the stress induced by the mismatch, which often results in die cracking. To reduce the stress, a smaller plate or clip may be used. However, the smaller contact area may result in higher resistance.

There is therefore a need in the art for a semiconductor package that includes a semiconductor power device connected to source and gate leads by means of patterned plates that overcomes the problems of the prior art. There is also a need for a patterned plate interconnection that does not float during solder reflow and ensures precise clip placement and location assurance. There is also a need for a semiconductor package having device metallized contacts for restricting the flow of solder during the soldering process. There is also a need for metalized contacts formed of Ni/Au. There is also a need for a semiconductor package process that increases throughput and provides easier assembly process control. There is also a need for a semiconductor package method that provides a soft attachment process of the patterned plates onto the semiconductor power device. There is also a need for a semiconductor package having an exposed source plate. There is also a need for a semiconductor package having reduced electrical resistance. There is a further need for a semiconductor package having improved thermal dissipation properties. There is also a need for a semiconductor package having improved mechanical properties. There is also a need for a semiconductor package having a stamped bridged lead frame plate.

SUMMARY OF THE INVENTION

The present invention overcomes the limitations of the prior art by providing a semiconductor device package having a bridged source plate interconnection between a source lead and a power semiconductor source metalized contact. A bridge portion of the bridged source plate may be exposed to allow for improved thermal dissipation. The bridged source plate connection provides for less contact area with the source metalized contact area. The bridged source plate may include dimples positioned to correspond to the source metalized contacts. Molding compound flows around and under the bridge portion to help anchor the bridged source plate in place.

In accordance with another aspect of the invention, a semiconductor package includes a leadframe having drain, source and gate leads. A semiconductor die is coupled to the leadframe and has at least one metalized source contact. A patterned source plate has a bridge portion, valley portions disposed on either side of the bridge portion, plane portions disposed on either side of the valley portions and the bridge portion and a connection portion depending from one of the plane portions. The patterned source plate connects the source lead with the at least one metalized source contact and an encapsulant covers at least a portion of the semiconductor die and the drain, source and gate leads.

In accordance with yet another aspect of the invention, a semiconductor package includes a leadframe having drain, source and gate leads. A semiconductor die is coupled to the leadframe, the semiconductor die having a plurality of Ni/Au or other solder wettable metal metalized source contact areas. A patterned source plate has a bridge portion, valley portions disposed on either side of the bridge portion, plane portions disposed on either side of the valley portions and the bridge portion, and a connection portion depending from one of the plane portions. The patterned source plate connects the source lead with the plurality of metalized source contact areas and an encapsulant covers at least a portion of the semiconductor die and drain, source and gate leads.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of design and to the arrangement of components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other methods and systems for carrying out the several purposes of the present invention. It is important, therefore, that the claims be regarded as including such equivalent methods and systems insofar as they do not depart from the spirit and scope of the present invention.

DETAILED DESCRIPTION OF THE INVENTION

Figure 1:
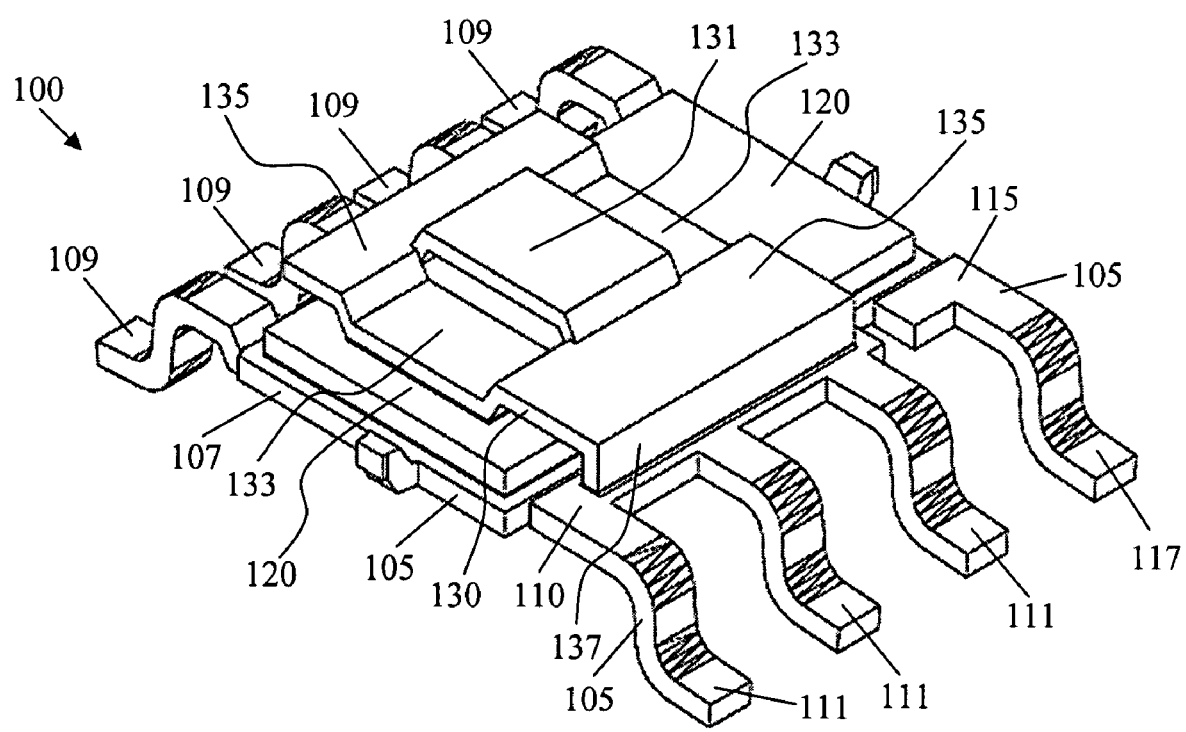
FIG. 1 is a perspective view showing a semiconductor package having a bridged source plate interconnection in accordance with the invention.
Figure 2:
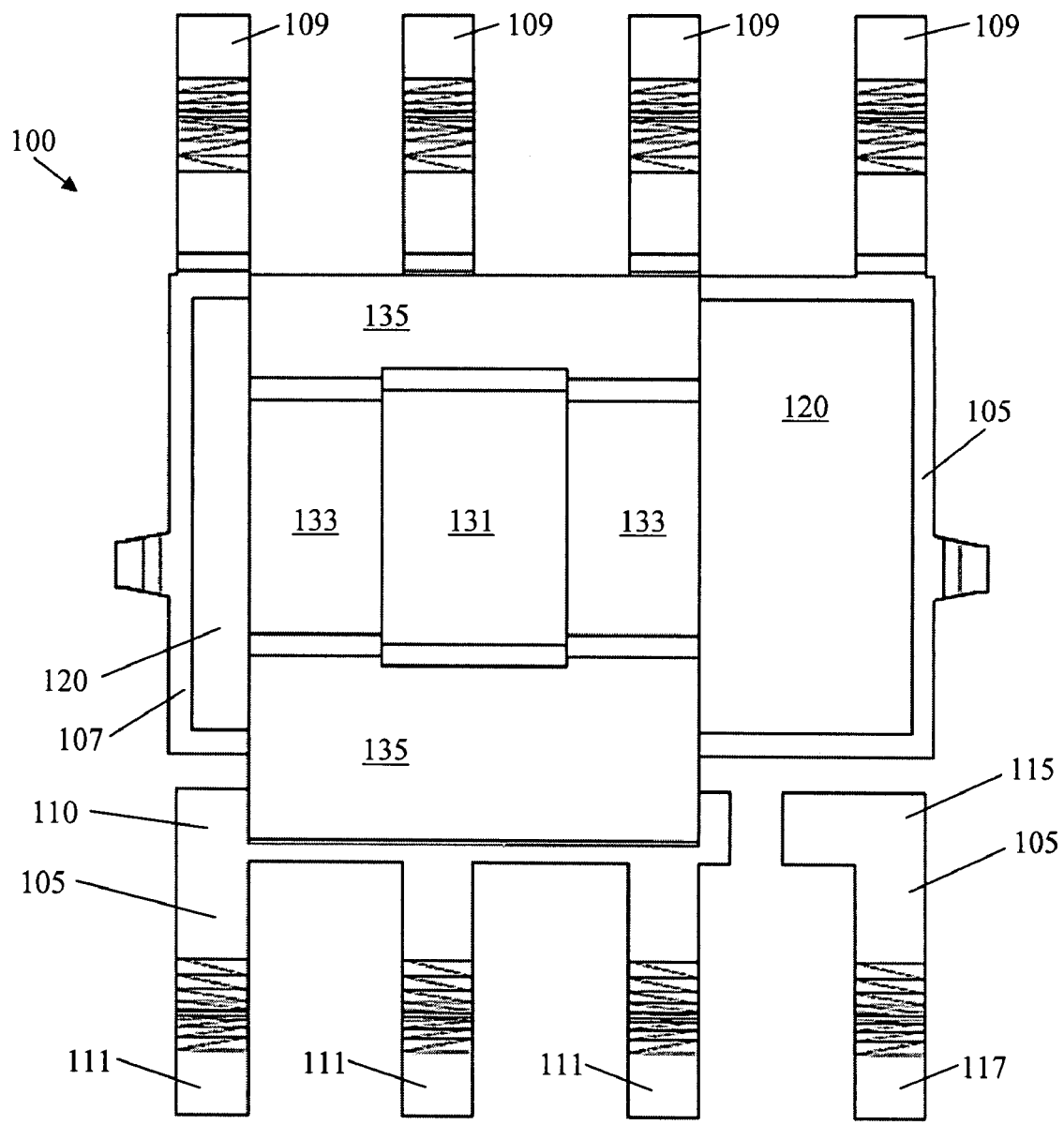
FIG. 2 is a top plan view of the semiconductor package of FIG. 1.
Figure 3:
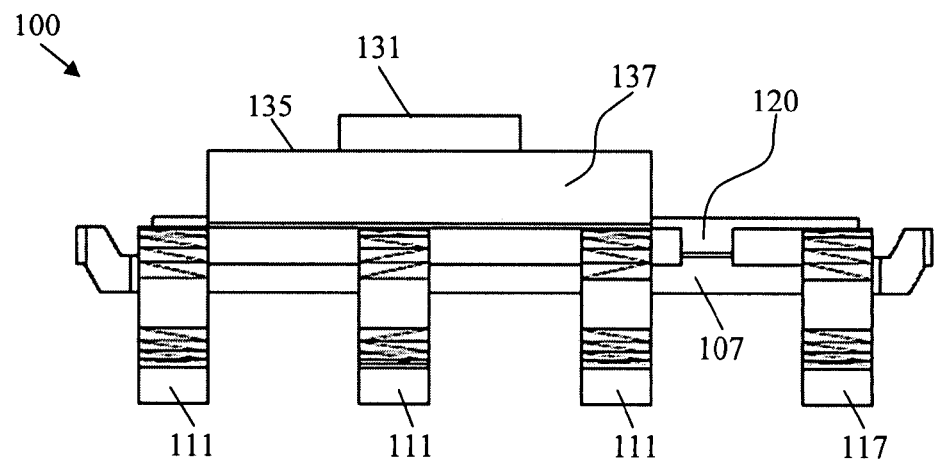
FIG. 3 is a side elevation view of the semiconductor package of FIG. 1.
Figure 4:
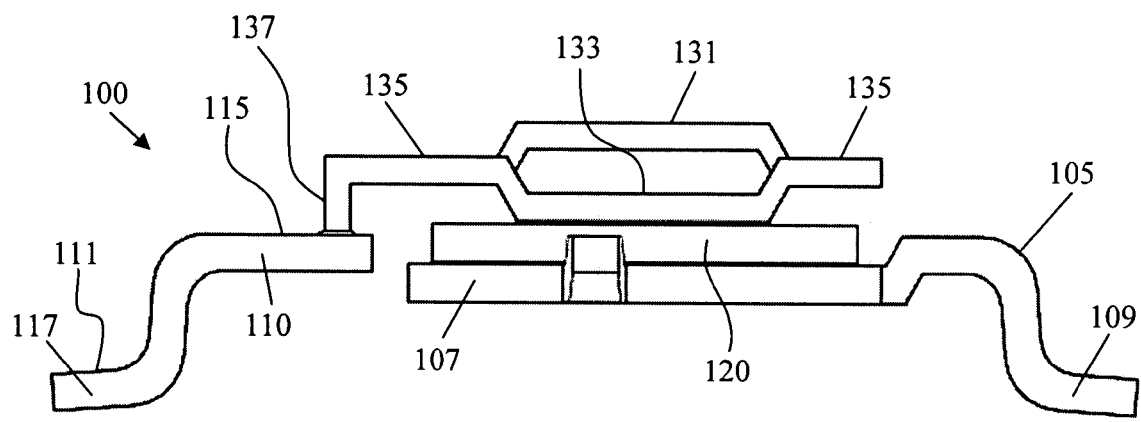
FIG. 4 is a cross sectional view of the semiconductor package of FIG. 1.

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a semiconductor device package having a bridged source plate interconnection between a leadframe source lead and a power semiconductor device metalized source contact or contacts. The bridged source plate includes a plate connection having a raised or bridge portion. The bridge portion lies above a plane of valley portions in contact with the metalized source contacts. The bridged source plate interconnection provides for a reduced contact area with the metalized source contacts. During encapsulation, bonding material flows under the bridge portion and provides mechanical strength to the bridged source plate interconnection. The metalized source contact is preferably a Ni/Au plated or sputtered surface. The metalized source contact provides for improved bonding of the bridged source plate interconnection and a reduction of overbonding which often introduces short circuit problems due to dielectric layer damage during wire bonding processes. The metalized source contact further eliminates the need for solder bumps and epoxy adhesive layers as soft solder and solder paste may be used to connect the bridged source plate to the metalized source contact.

In a first aspect of the invention and with reference to FIGS. 1-6, a semiconductor package generally designated 100 includes a leadframe 105 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metalized drain area (not shown) coupled to the die pad 107 by solder reflow. Connection between the gate contact portion 115 and a gate metalized contact area may be by a gate plate or a bonding wire.

In the perspective view of FIG. 1, the source contact portion 110 and the gate contact portion 115 appear to be very close to the die pad 107. However these contact portions are separated from the die pad 107 as can be plainly seen in top plan view of FIG. 2. The same applies to the perspective views of FIG. 7 and FIG. 8.

Semiconductor source and gate metalized contacts may be formed by Ni/Au or Ni/Pd/Au plating or sputtering, or other under bump metallization process.

A bridged source plate 130 includes a metal plate stamped or punched to form a bridge portion 131, valley portions 133 on either side of the bridge portion 131, plane portions 135 on either side of the valley portions 133 and the bridge portion 131, and a connection portion 137 depending from one of the plane portions 135. Bridge portion 131 is disposed in a plane above the plane of the valley portions 133 while the plane portions 135 are disposed in a plane intermediate the plane of the bridge portion 131 and the plane of the valley portions 133. Bridged source plate 130 may be stamped or punched in several steps or in a single step using a die. The connection portion 137 contacts the source contact portion 110 while the valley portions 133 contact the source metalized contact or contacts. Bridged source plate 130 may be coupled to the metalized source contact by solder reflow using soft solder or solder paste. Metalized source contacts may cover a substantial portion of a top surface of the die 120 for improved heat dissipation and decreased resistance and inductance.

Figure 5:
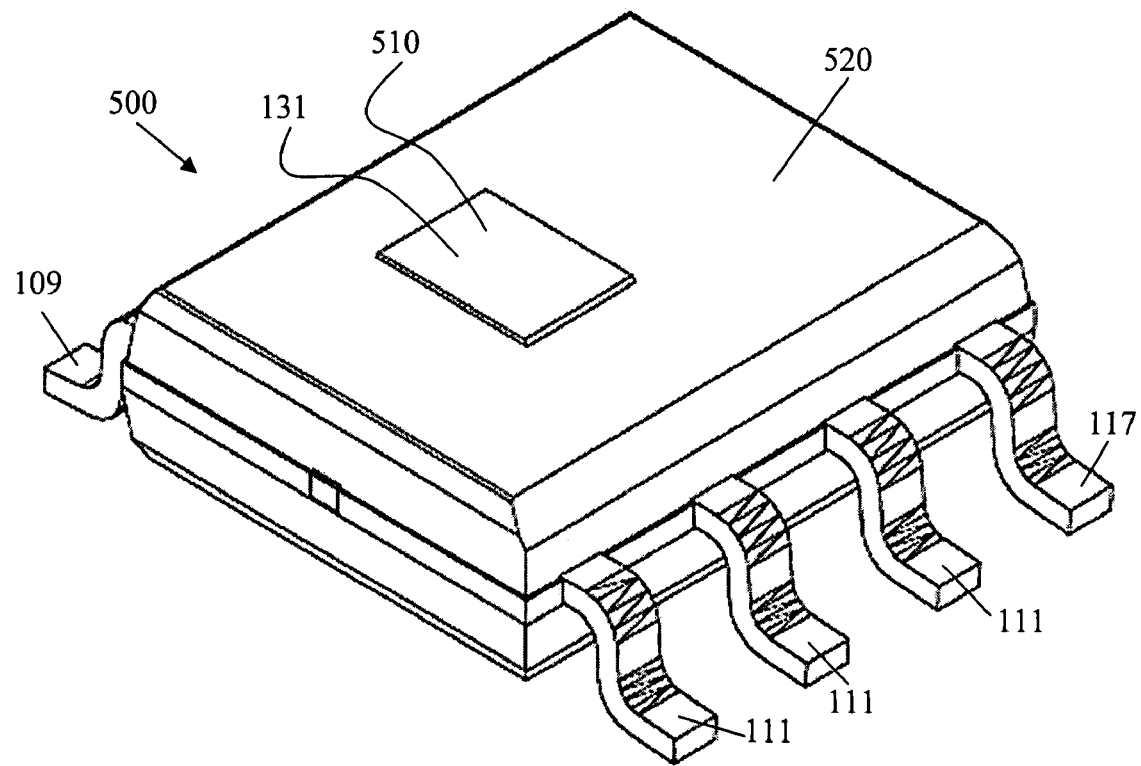
FIG. 5 is a molded semiconductor package having an exposed bridge portion of a bridged source plate in accordance with the invention.

With particular reference to FIG. 5, in a preferred embodiment of the invention a semiconductor package generally designated 500 includes a top surface 510 of the bridged source plate bridge portion 131 exposed through an encapsulant 520. The exposed top surface 510 provides for thermal dissipation of heat generated by the power semiconductor die 120. In addition, the exposed top surface 510 provides an attachment surface for an additional heat sink for additional heat dissipation Flow of encapsulant material under the bridge portion 131 provides for increased mechanical strength of the package 500.

Figure 6:
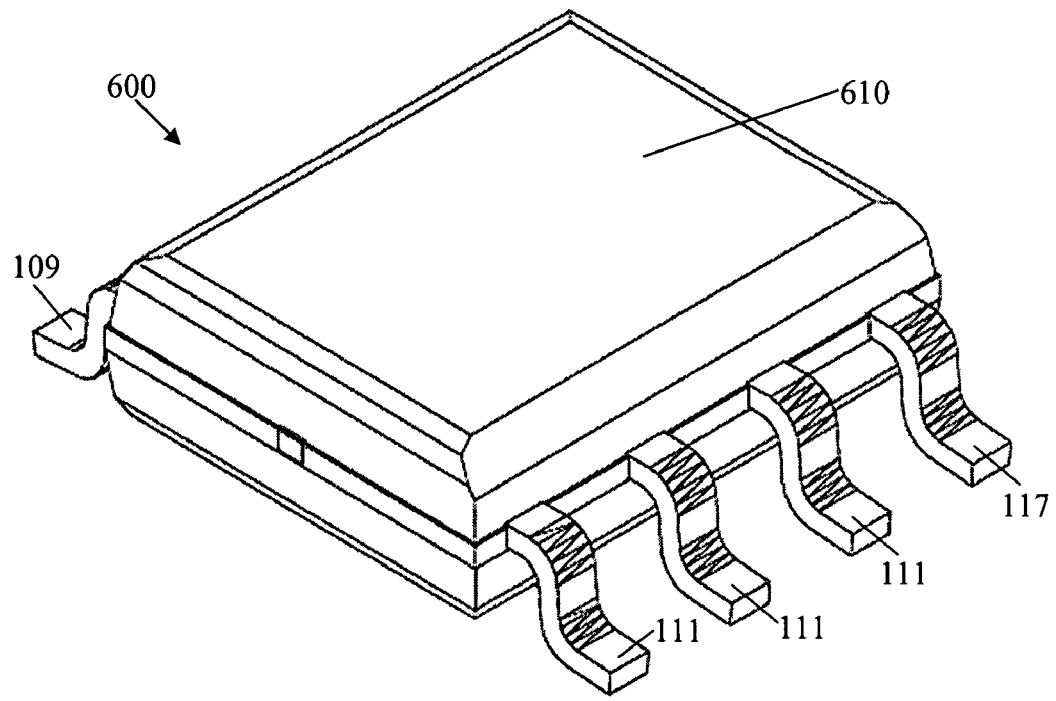
FIG. 6 is a molded semiconductor package having an unexposed bridge portion of the bridged source plate in accordance with the invention.

With reference to FIG. 6, in another embodiment of the invention a semiconductor package generally designated 600 includes an encapsulant 610 covering the power semiconductor die 120 and at least a portion of the drain, source and gate leads. The top surface 510 of the bridge portion 131 is not exposed through the encapsulant 610.

Figure 7:
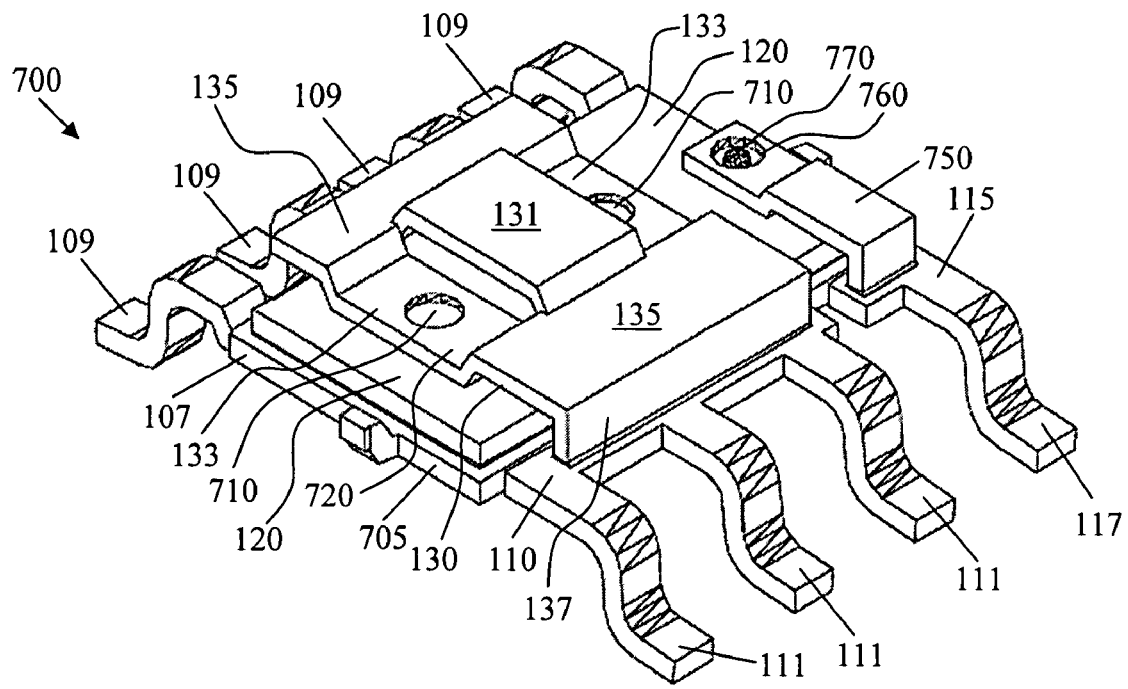
FIG. 7 is an alternative embodiment of the semiconductor package having a bridged source plate in accordance with the invention.
Figure 8:
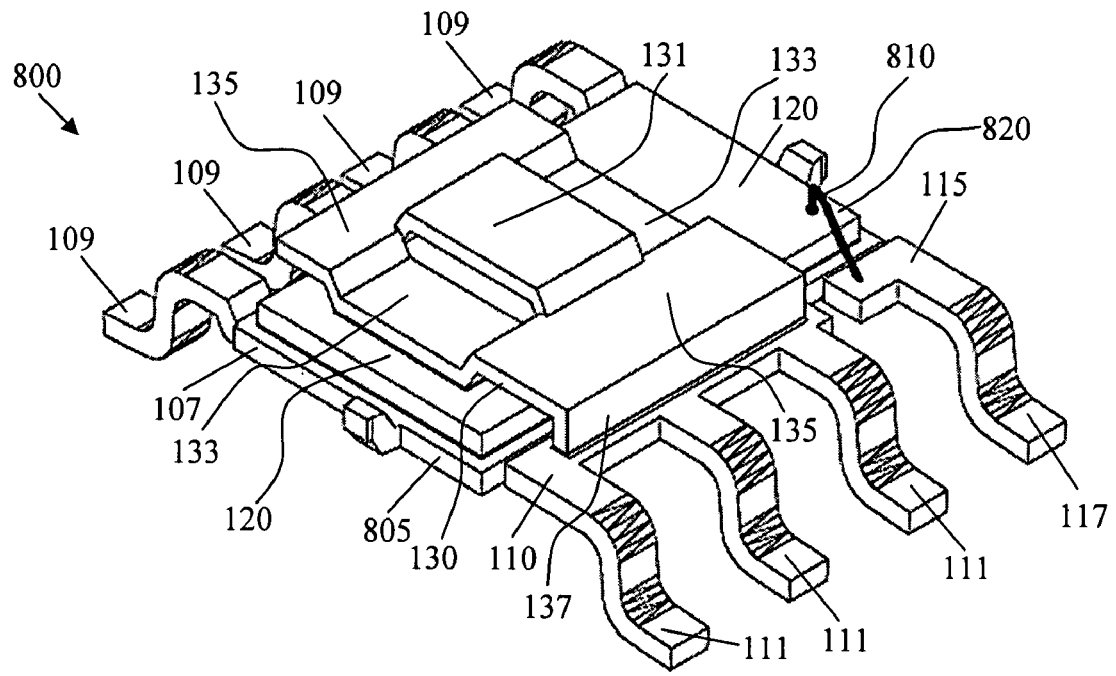
FIG. 8 is yet another alternative embodiment of the semiconductor package having a bridged source plate in accordance with the invention.
Figure 9:
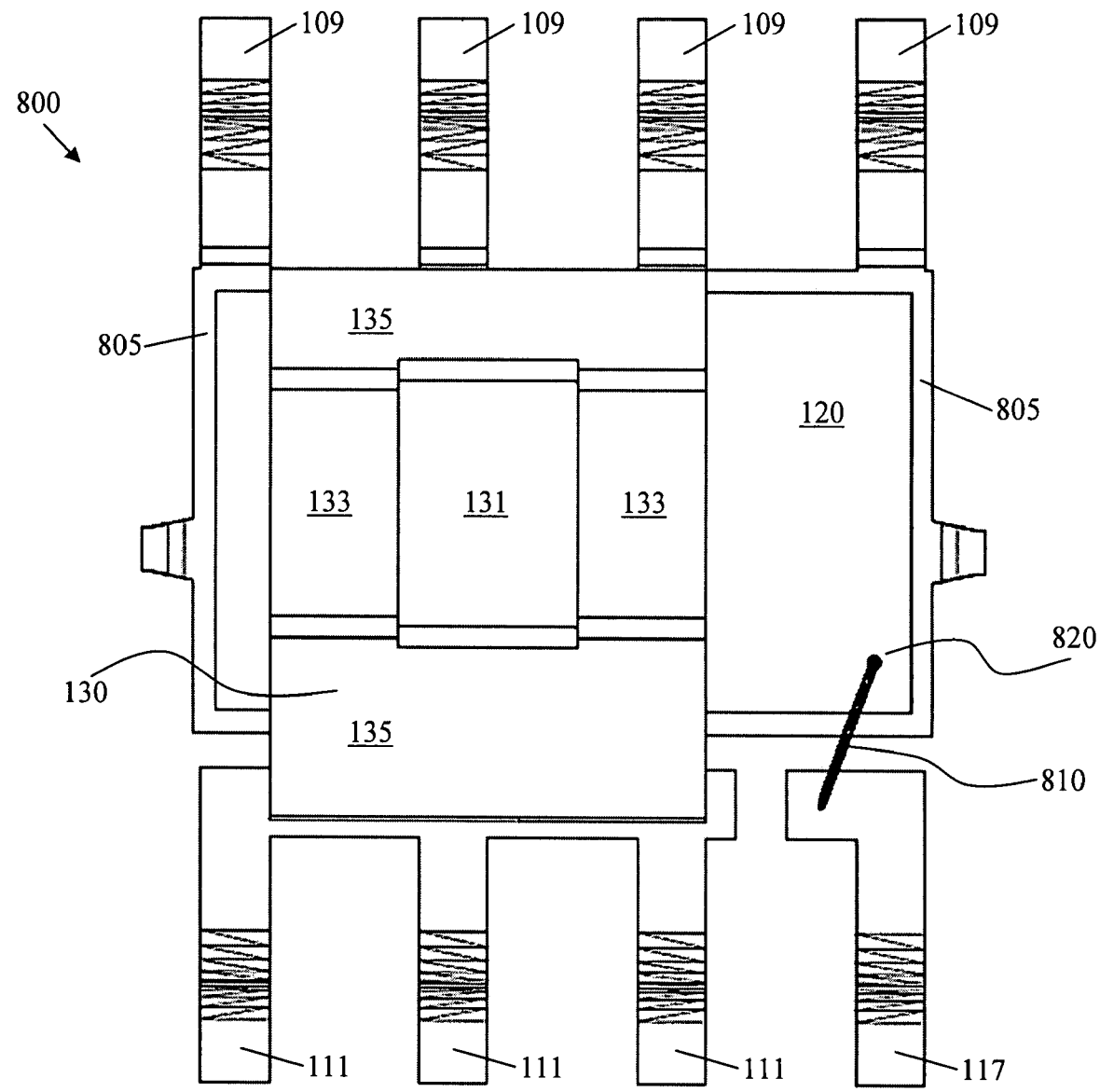
FIG. 9 is a top plan view of the semiconductor package of FIG. 8.
Figure 10:
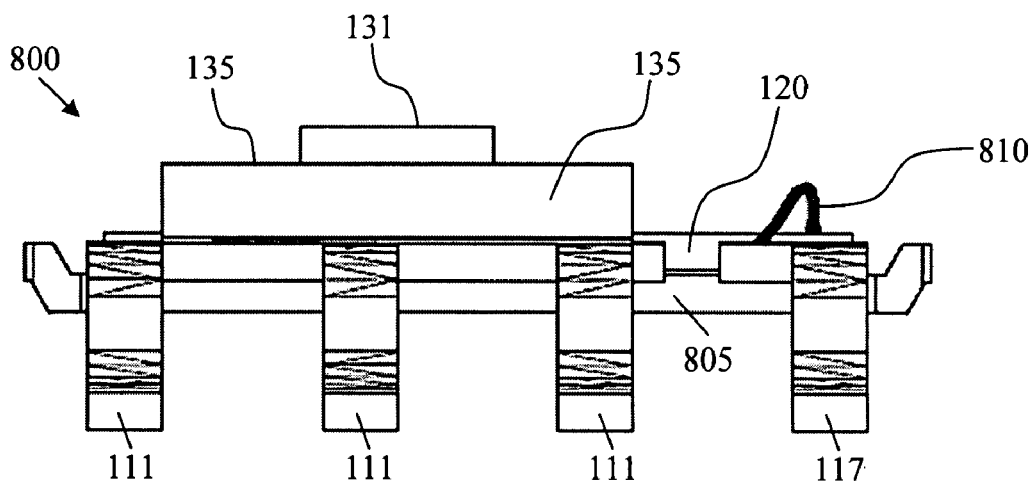
FIG. 10 is a side elevation view of the semiconductor package of FIG. 8.
Figure 11:
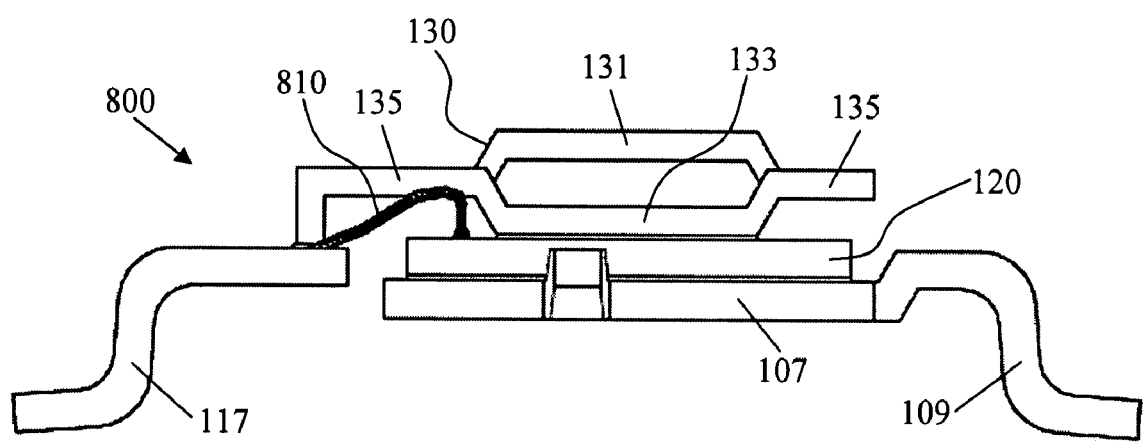
FIG. 11 is a cross sectional view of the semiconductor package of FIG. 8.

In another aspect of the invention, and with reference to FIG. 7, a semiconductor package generally designated 700 includes a leadframe 705 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metalized drain area (not shown) coupled to the die pad 107 by solder reflow.

A bridged source plate 130 includes a metal plate stamped or punched to form a bridge portion 131, valley portions 133 on either side of the bridge portion 131, plane portions 135 on either side of the valley portions 133 and the bridge portion 131, and a connection portion 137 depending from one of the plane portions 135. Bridged source plate 130 may be stamped or punched in several steps or in a single step using a die. The connection portion 137 contacts the source contact portion 110 while the valley portions 133 contact the source metalized contact or contacts. Bridged source plate 130 includes a pair of dimples 710 formed in respective valley portions 133. The dimples 710 are concave with respect to a top surface 720 of the valley portions 133 and have bottom surfaces (not shown) extending beyond a plane of a bottom surface thereof. In an alternative embodiment, the dimples 710 have through holes (not shown). Dimpled plate interconnections are disclosed in commonly assigned application Ser. No. 11/799,467 entitled "Semiconductor Package Having Dimpled Plate Interconnections", the disclosure of which is incorporated herein in its entirety.

It has been found that the bridged source plate 130 is not prone to floating due to the number of distinct source plate dimples 710 contacting the source metalized contact or contacts. Furthermore, the metalized contacts advantageously restrict the flow of soft solder and solder paste to the confines of the metalized contacts during solder reflow, thereby reducing the incidence of undesirable shapes and short circuits.

A gate plate 750 electrically connects the gate contact portion 115 of the gate lead 117 to a gate metallized contact area (not shown) on the power semiconductor die 120. A gate plate dimple 760 is positioned and stamped or punched on the gate plate 750 so as to align with the gate metalized contact of the semiconductor die 120 during solder reflow. The gate plate dimple 760 can optionally include a through hole 770. The through hole 770 allows for the formation of locking balls formed during solder reflow to provide mechanical stability to the gate plate 750. The dimples 710 are optional and in an alternative embodiment of the invention, the semiconductor package has a gate clip 750 but no source dimples 710. The valley portions 133 may be coupled to the metalized source contact of the die 120 by solder reflow using soft solder or solder paste without the use of dimples. In yet another alternative embodiment, the gate plate 750 has no gate plate dimple 760, and the gate plate 750 may be coupled to the metalized source contact of the die 120 by solder reflow using soft solder or solder paste without the use of dimples.

In another aspect of the invention, and with reference to FIGS. 8-11, a semiconductor package generally designated 800 includes a leadframe 805 having a die pad 107, a source contact portion 110 and a gate contact portion 115. Source contact portion includes source leads 111, the gate contact portion includes a gate lead 117 and the die pad 107 includes drain leads 109. A power semiconductor die 120 may have a metalized drain area (not shown) coupled to the die pad 107 by solder reflow.

A bridged source plate 130 includes a metal plate stamped or punched to form a bridge portion 131, valley portions 133 on either side of the bridged portion 131, plane portions 135 on either side of the valley portions 133 and the bridge portion 131, and a connection portion 137 depending from one of the plane portions 135. Bridge portion 131 is disposed in a plane above the plane of the valley portions 133 while the plane portions 135 are disposed in a plane intermediate the plane of the bridge portion 131 and the plane of the valley portions 133. Bridged source plate 130 may be stamped or punched in several steps or in a single step using a die. The connection portion 137 contacts the source contact portion 110 while the valley portions 133 contact the source metalized contact or contacts. Metalized source contacts may cover a substantial portion of a top surface of the die 120 for improved heat dissipation and decreased resistance and inductance. In an alternate embodiment of the invention, source plate dimples (not shown) may be used to connect the valley portions 133 to the metalized source contacts of the die 120.

The gate contact portion 115 is coupled to a gate metalized contact 820 by means of a bonding wire 810.

Figure 12:
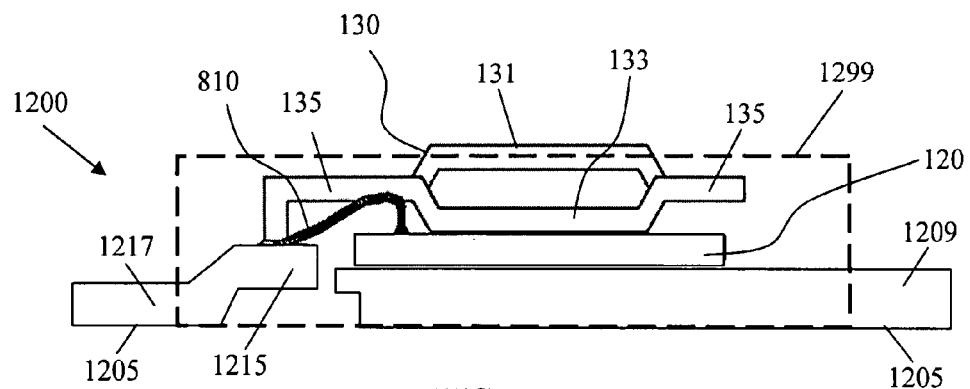
FIG. 12 is a cross sectional view of an alternative embodiment of the semiconductor package in accordance with the invention.
Figure 13:
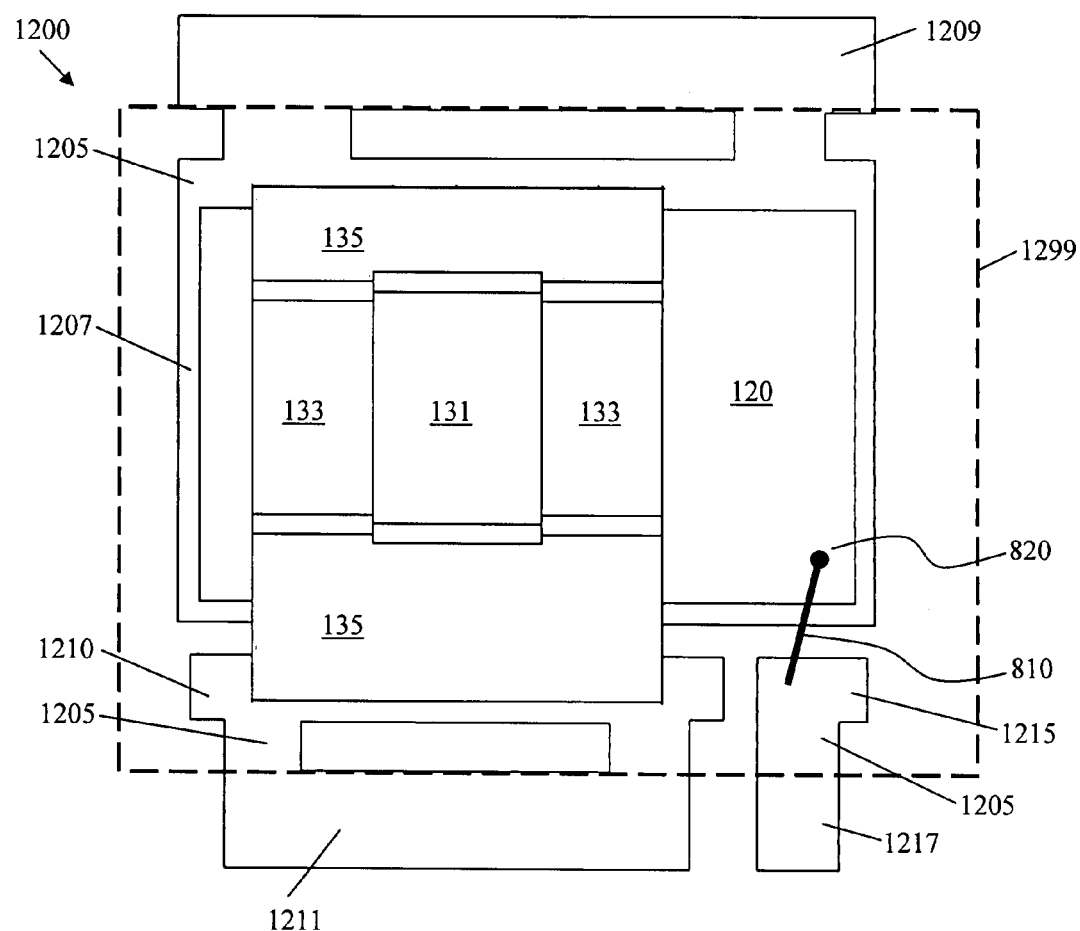
FIG. 13 is a top view of the semiconductor package of FIG. 12.

The bridged source plate 130 can be used in different package types. With reference to FIG. 12 and FIG. 13, a flat-lead package 1200 in accordance with the present invention is shown. A die 120 having a drain contact on a bottom surface and source and gate contacts on a top surface is coupled to a die pad 1207 of leadframe 1205. The leadframe 1205 also includes a source contact portion 1210 and a gate contact portion 1215, though none of these parts are in direct physical or electrical contact with each other. Drain lead 1209 of die pad 1207 establishes electrical connection to drain of the die 120. A bridged source plate 130 connects the source contact of die 120 to source lead 1211 of the source contact portion 110 and a bonding wire 810 connects the gate contact of die 120 to the gate lead 1217 of the gate contact portion 1215. Alternatively, a gate plate (not shown) connects the gate contact of die 120 to the gate lead 1217. Unlike the other embodiments disclosed above where the drain leads 109, source leads 111 and gate lead 117 are bent outside the molding compound 1299, the semiconductor package 1200 provides a lower profile package with flat drain leads 1209, flat source leads 1211 and flat gate lead 1217 extending outside the molding compound 1299 without bending. A portion of the bottom of die pad 1207 may be exposed to provide electrical contact to the drain and to provide better thermal dissipation. Alternatively, the leads may be cut off at the molding compound side surface providing electrical contacts on both bottom and side surfaces of the molding compound encapsulation 1299.

Semiconductor source and gate metalized contacts may be formed by Ni/Au or Ni/Pd/Au plating or sputtering, or other under bump metallization processes. Furthermore, semiconductor die 120 in general is a MOSFET with its source contact and gate contact on the top surface and the drain contact on the bottom surface. However for some specific applications it is desirable to have a MOSFET die with a source contact on the bottom surface and the drain and gate contacts on the top surface. A bottom source MOSFET semiconductor device is disclosed in commonly assigned application Ser. No. 11/495,803 entitled "BOTTOM SOURCE LDMOSFET STRUCTURE AND METHOD", the disclosure of which is incorporated herein in its entirety. When the bridged plate of the present invention is applied to a package having a bottom source MOSFET die according to the embodiments disclosed above, the source and drain contacts are switched, with the bridged plate now connecting the drain of the bottom source die to the drain leads.

The present invention advantageously provides for a bridged plate interconnection having a bridge portion. In preferred embodiments, the bridge portion is exposed to provide for improved thermal performance. In other preferred embodiments, dimples are positioned on valley portions of the bridged plate to correspond to metalized contacts. The dimpled plate ensures that the bridged plate interconnection does not float during solder reflow to thereby ensure precise plate placement and location assurance. The bridged plate is stamped or punched to decrease the cost of the bridge plate.

It should be understood, of course, that the foregoing relates to preferred embodiments of the invention and that modifications may be made without departing from the spirit and scope of the invention as set forth in the following claims.

We claim:

1. A semiconductor package comprising:
   a leadframe having drain, source and gate leads;
   a semiconductor die coupled to the leadframe, the semiconductor die having at least one metalized source contact;
   a bridged source plate having a bridge portion, valley portions disposed on either side of the bridge portion, plane portions disposed on either side of the valley portions and the bridge portion and a connection portion depending from one of the plane portions, the bridged source plate connecting the source lead with the at least one metalized source contact area; and
   an encapsulant covering at least a portion of the semiconductor die and the drain, source and gate leads such that a top surface of the bridge portion is exposed through the encapsulant.

2. The semiconductor package of claim 1, further comprising dimples formed in the valley portions, the dimples being positioned for contact with the at least one metalized source contact.

3. The semiconductor package of claim 2, wherein the dimples comprise a through hole through which the bridged source plate interconnection is soldered to the at least one source metalized contact.

4. The semiconductor package of claim 2, wherein the at least one metalized source contact comprises an upper Ni/Au layer.

5. The semiconductor package of claim 1, wherein the valley portions contact the at least one metalized source contact.

6. The semiconductor package of claim 1, wherein the gate lead is connected to a metalized gate contact by a bonding wire.

7. The semiconductor package of claim 1, wherein the gate lead is connected to a metalized gate contact by a gate plate.

8. The semiconductor package of claim 1, wherein the bridge portion is disposed in a plane above a plane of the valley portions.

9. The semiconductor package of claim 8, wherein the plane portions are disposed in a plane intermediate the plane of the bridge portion and the plane of the valley portions.

10. The semiconductor package of claim 1, wherein the connection portion is electrically coupled to a leadframe source contact portion.

11. The semiconductor package of claim 1, wherein the at least one metalized source contact comprises Ni/Au.

12. The semiconductor package of claim 1, wherein the at least one metalized source contact comprises Ni/Pd/Au.

13. A semiconductor package comprising:
    a leadframe having a die pad and first, second and third leads, the first lead being electrically connected to the die pad;
    a semiconductor die having a first metalized contact on a bottom surface thereof coupled to the die pad, and second and third metalized contacts on a top surface opposite the bottom surface;
    a bridged plate having a bridge portion, valley portions disposed on sides of the bridge portion, plane portions disposed on either side of the valley portions and the bridge portion, the bridged plate connecting the second lead with the second metalized contact; and
    an encapsulant covering at least a portion of the semiconductor die and the first, second and third leads such that a toy surface of the bridge portion is exposed though the encapsulant.

14. The semiconductor package of claim 13, further comprising at least one dimple formed in the valley portions, the dimples being positioned for contact with the second metalized contact.

15. The semiconductor package of claim 14, wherein the dimples comprise a through hole through which the bridged plate interconnection is soldered to the second metalized contact.

16. The semiconductor package of claim 13, wherein the bridge portion is disposed in a plane above a plane of the valley portions.

17. The semiconductor package of claim 16, wherein the plane portions are disposed in a plane intermediate the plane of the bridge portion and the plane of the valley portions.

18. The semiconductor package of claim 13, wherein the bridged plate further comprises a connection portion depending from one of the plane portions and coupled to the second lead.

19. The semiconductor package of claim 13, wherein portions of the first, second and third leads that extend outside the encapsulant are bent.

20. The semiconductor package of claim 13, wherein portions of the first, second and third leads that extend outside the encapsulant are flat.

21. The semiconductor package of claim 13 wherein the first, second and third leads terminate at a side surface of encapsulant.

22. The semiconductor package of claim 13, wherein a bottom surface of the die pad is exposed through the encapsulant.

23. The semiconductor package of claim 13, wherein the bridged plate is stamped or punched in order to form the valley portions and the bridge portion.

* * * * *